(12) United States Patent
Lin et al.

(10) Patent No.: US 6,661,287 B2
(45) Date of Patent: Dec. 9, 2003

(54) AUTOMATIC GAIN CONTROL CIRCUIT AND CONTROL METHOD

(75) Inventors: Jyhfong Lin, Hsin-Tien Shin (TW); Yibin Hsieh, Hsin-Tien Shin (TW); Chin-Chang Chien, Hsin-Tien Shin (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/215,607

(22) Filed: Aug. 8, 2002

(65) Prior Publication Data
US 2003/0179046 A1 Sep. 25, 2003

(30) Foreign Application Priority Data
Mar. 22, 2002 (TW) ......................................... 91105535 A (51) Int. Cl.[7] .............................. H03G 3/30; G06G 7/12
(52) U.S. Cl. ...................................................... 330/254
(58) Field of Search ................................. 330/129, 138, 330/254, 279, 280, 306; 327/560–563

(56) References Cited

U.S. PATENT DOCUMENTS

| | | | | |
|---|---|---|---|---|
| 5,220,468 A | * | 6/1993 | Sidman | 330/279 |
| 5,350,908 A | * | 9/1994 | Bechtel | 330/129 |
| 5,805,022 A | * | 9/1998 | Bruccoleri et al. | 330/254 |
| 5,825,239 A | * | 10/1998 | Adal | 327/563 |
| 6,567,489 B1 | * | 5/2003 | Glover | 375/376 |

* cited by examiner

Primary Examiner—My-Trang Nu Ton
(74) Attorney, Agent, or Firm—J. C. Patents (57) ABSTRACT

An automatic gain control circuit and control method. A variable gain amplifier amplifies a differential input signal. The amplified signal is passed to a filtering circuit for filtering. The amplitude of the filtered output signal is checked using a peak value inspection circuit. The result of inspection is used to set the gain of the variable gain amplifier and further adjust the amplitude of the output signal. The peak value inspection circuit comprises a non-inverted phase differential comparator, an inverted phase differential comparator, an OR gate and a charge/discharge circuit. The output signal is compared with a reference signal through two differential comparators. The result of comparison controls the charge/discharge circuit so that the gain of the variable gain amplifier is varied and the amplitude of the output signal is controlled.

14 Claims, 6 Drawing Sheets

AUTOMATIC GAIN CONTROL CIRCUIT AND CONTROL METHOD

CROSS-REFERENCE TO RELATED APPLICATION

This application claims the priority benefit of Taiwan application serial no. 91105535, filed Mar. 22, 2002.

BACKGROUND OF THE INVENTION

1. Field of Invention

The present invention relates to an automatic gain control (AGC) circuit. More particularly, the present invention relates to an automatic gain control circuit using a feedback control to modify the gain factor of a voltage gain amplifier (VGA).

2. Description of Related Art

In analogue signal processing circuits for magnetic or optical disc, the received input signals are often varied due to different pick-up devices or storage mediums. Hence, an automatic gain control circuit is frequently employed to maintain proper output signals for subsequent signal processing. And in order to maintain a proper output signal level, the gain of the automatic gain control circuit needs to be varied according to the received input signal. In other words, the gain is decreased when the input signal level is increased and the gain is increased when the input signal level is reduced.

Figure 1:
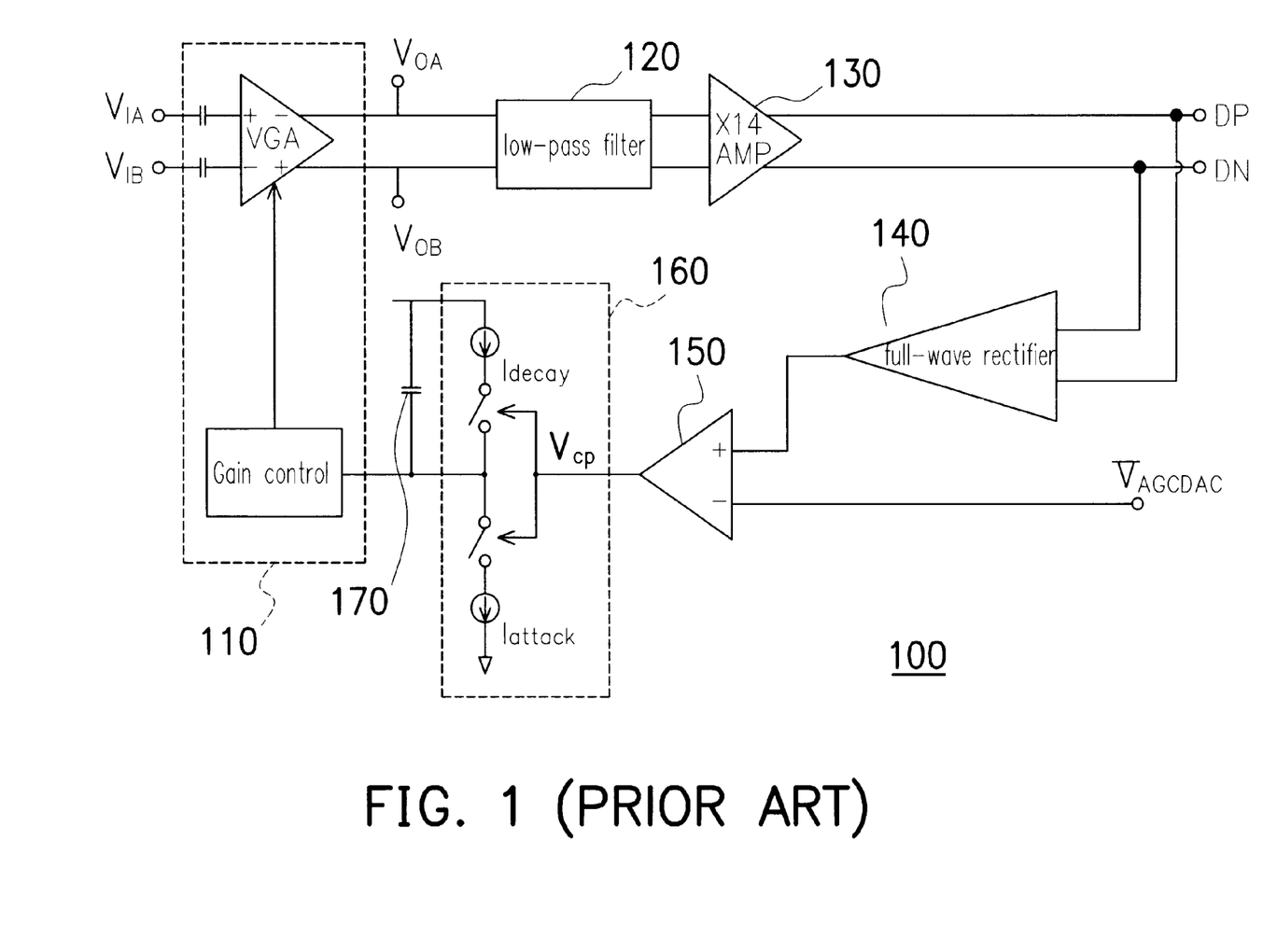
FIG. 1 is an equivalent circuit diagram of a conventional automatic gain control circuit.

FIG. 1 is an equivalent circuit diagram of a conventional automatic gain control circuit 100. As shown in FIG. 1, the automatic gain control circuit 100 includes a variable gain amplifier (VGA) 110, a low-pass filter 120, an amplifier 130 (having a fixed gain), a full-wave rectifier 140, a comparator 150, a charge-pump circuit 160 and a capacitor 170. Differential input signals $V_{IA}$, $V_{IB}$ produce output signals DP, DN after passing through the amplifier circuits and the filtering circuit such as the variable gain amplifier 110, the low-pass filter 120 and the fixed-gain amplifier 130. After rectification of the output signals DP, DN by the full-wave rectifier 140, the rectified signal is passed to the comparator 150 to compare with a required magnitude $V_{AGCDAC}$ to produce a compare result signal $V_{cp}$. Utilizing the compare result signal $V_{cp}$, the charge-pump circuit 160 is controlled to charge or discharge the capacitor 170 and vary the potential difference across the capacitor 170 so that the gain of the variable gain amplifier 110 can be adjusted. When the amplitude of the output signals DP, DN is greater than the required magnitude $V_{AGCDAC}$, the comparator 150 outputs a high level compare result signal $V_{CP}$ to control the current $I_{attack}$ within the charge-pump circuit 160 and charge up the capacitor 170. Hence, reducing the gain of the variable gain amplifier 110. On the other hand, when the amplitude of the output signals DP, DN is smaller than the magnitude $V_{AGCDAC}$, the comparator 150 outputs a low level compare result signal $V_{CP}$ to control the current $I_{decay}$ within the charge-pump circuit and discharge the capacitor 170. Ultimately, the gain of the variable gain amplifier 110 is increased. Nevertheless, this type of automatic gain control circuit is limited by the bandwidth of the full-wave rectifier 140. When the input signals contain high frequency components, a full-wave rectifier having a bandwidth wide enough to accommodate the high frequency components of the signals is difficult to implement. In addition, the gain of a full-wave rectifier also affects precision of the entire circuit.

Figure 2:
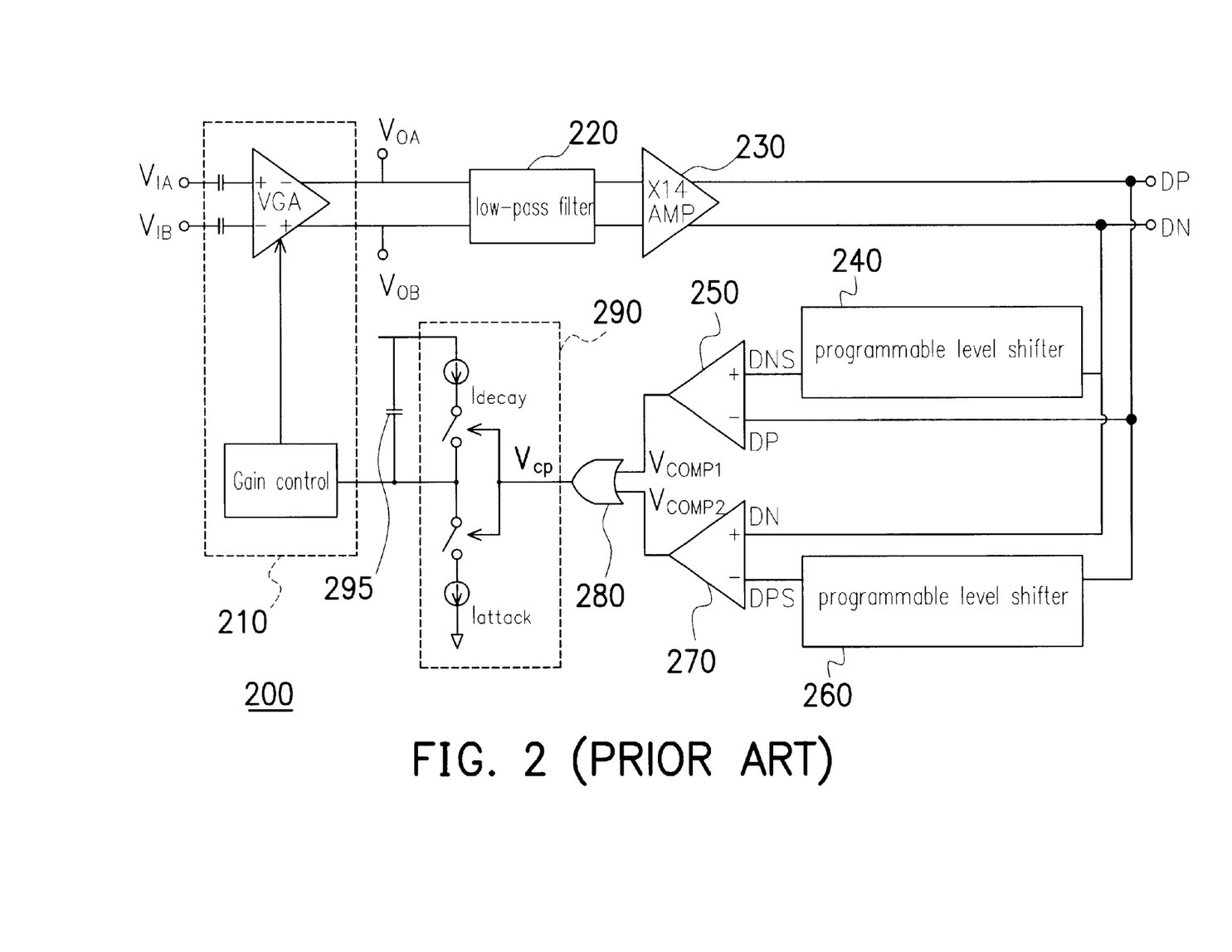
FIG. 2 is an equivalent circuit diagram of another conventional automatic gain control circuit.
Figure 3:
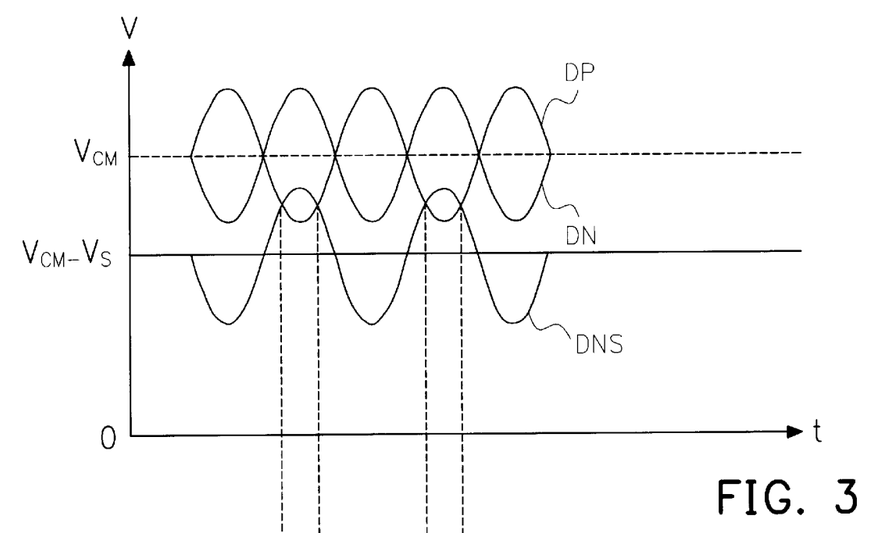
FIG. 3 is a graph showing the waveform of the output signals DP, DN and the shifted output signal DNS according to FIG. 2 after the output signal DN passes through the programmable level shifter to shift by an amount Vs.
Figure 4:
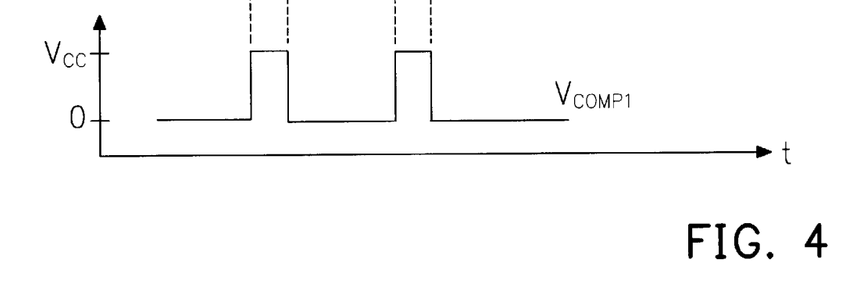
FIG. 4 is a graph showing the waveform of a first compare result signal $V_{COMP1}$ according to FIG. 2.

FIG. 2 is an equivalent circuit diagram of another conventional automatic gain control circuit. As shown in FIG. 2, the automatic gain control circuit 200 includes a variable gain amplifier 210, a low-pass filter 220, a fixed-gain amplifier 230, a pair of programmable level shifters (240, 260), a pair of comparators 250, 270, an OR-gate 280, a charge-pump circuit 290 and a capacitor 295. The principle of operation is very similar to the automatic gain control circuit shown in FIG. 1 except with an improvement over the bandwidth limitation of the full-wave rectifier 140 of FIG. 1. The full-wave rectifier 140 and the comparator 150 for generating the compare result signal $V_{CP}$ in FIG. 1 are replaced by the programmable level shifters 240, 260, the comparators 250, 270 and the OR-gate 280 in FIG. 2. Here, only the operation of the programmable level shifter 240 the comparator 250 is illustrated with reference to FIGS. 3 and 4. FIG. 3 is a graph showing the waveforms of the output signals DP, DN and a shifted output signal DNS after the output signal DN passes through the programmable level shifter 240 to shift by an amount of Vs. FIG. 4 is a graph showing the waveform of a first compare result signal $V_{COMP1}$ after passing the shifted output 15 signal DNS into the comparator 250 to compare with the output signal DP. When the amplitude of the output signals DP, DN is large, the comparators 250, 270 will output high level first and second compare result signals $V_{COMP1}$ and $V_{COMP2}$ respectively. According to the first and the second compare result signals $V_{COMP1}$ and $V_{COMP2}$, the OR-gate produces a compare result signal $V_{CP}$ to control the current $I_{attack}$ of the charge-pump circuit 290 to charge the capacitor 295. Hence, reducing the gain of the variable gain amplifier 210. On the other hand, when the amplitude of the output signals DP, DN is too small, the comparators 250, 270 output low level first and second compare result signals $V_{COMP1}$ and $V_{COMP2}$. According to the first and the second compare result signals $V_{COMP1}$, and $V_{COMP2}$, the OR-gate produces a compare result signal $V_{CP}$ to control the current $I_{decay}$ of the charge-pump circuit 290 to discharge the capacitor 295. Ultimately, the gain of the variable gain amplifier 210 is increased.

However, the automatic gain control circuit 200 in FIG. 2 still contains the following drawbacks:
1. The programmable level shifters may lead to a phase difference between differential signals, thereby affecting processing precision.
2. The programmable level shifters increase the loading along the signal path so that bandwidth of the automatic gain control circuit is reduced.
3. If the output signals have large amplitudes, programmable level shifters having a large output range and wide bandwidth are required and hence difficult to implement with low voltage circuits.

SUMMARY OF THE INVENTION

Accordingly, one object of the present invention is to provide an automatic gain control circuit and control method that not only increases the bandwidth of the automatic gain control circuit, but also permits its implementation using low voltage circuits.

To achieve these and other advantages and in accordance with the purpose of the present invention, as embodied and broadly described herein, the invention provides an automatic gain control circuit capable of controlling its gain according to incoming reference signals. The gain control circuit includes a variable gain amplifier, a filtering circuit and a peak value inspection circuit. The variable gain amplifier receives differential input signals and amplifies the differential input signals by the gain to produce an amplified signal. The magnitude of the gain can be varied. The filtering circuit receives the amplified signal and produces differential output signals after filtering. The peak value inspection circuit receives the differential output signals and compares with a reference signal differentially to produce a control signal. The gain of the variable gain amplifier is controlled by the control signal.

In one embodiment of the present invention, the peak value inspection circuit includes a non-inverted phase differential comparator and an inverted phase differential comparator, an OR-gate and a charge/discharge circuit. The non-inverted phase differential comparator performs a differential comparison between the differential output signals and the reference signal to produce a non-inverted compare result signal. The inverted phase differential comparator performs a differential comparison between the inverted differential output signals and the reference signal to produce an inverted compare result signal. The OR-gate performs a logic operation between the non-inverted compare result signal and the inverted compare result signal to produce a combined compare result signal. The charge/discharge circuit utilizes the combined compare result signal to generate a control signal for controlling the gain of the circuit. The charge/discharge circuit can be a system that includes a charge-pump circuit and a capacitor, for example.

The filtering circuit according to the embodiment of the present invention further includes an amplifier circuit for generating the differential output signals. The original signal is magnified up to 14 times by the amplifier circuit and filtering is achieved by using a seven pole low-pass filter, for example.

The present invention also provides a method for controlling circuit gain according to a reference signal. The method of controlling the gain of amplified differential input signals includes the following steps. First, the differential input signals are amplified by the gain to produce an amplified signal. The magnitude of the gain can be controlled. The amplified signal is filtered to produce differential output signals. The differential output signals and the reference signal are compared to produce a control signal for controlling the gain of a variable gain amplifier.

The method of generating control signal further includes the following steps. A differential comparison between the differential output signals and the reference signal is carried out to produce a non-inverted compare result signal. A differential comparison between an inverted differential output signal and the reference signal is carried out to produce an inverted compare result signal. Thereafter, an OR operation between the non-inverted compare result signal and the inverted compare result signal is conducted to produce a combined compare result signal. According to the combined compare result signal resulting from the comparisons, the control signal for controlling the output gain is adjusted.

To provide a wider operating bandwidth, a peak value inspection circuit comprising full differential comparators is used to detect the magnitude of output signals so that the gain of the variable gain amplifier can be modified. Hence, aside from simplifying the automatic gain control circuit considerably, low voltage circuits may be used.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 5:
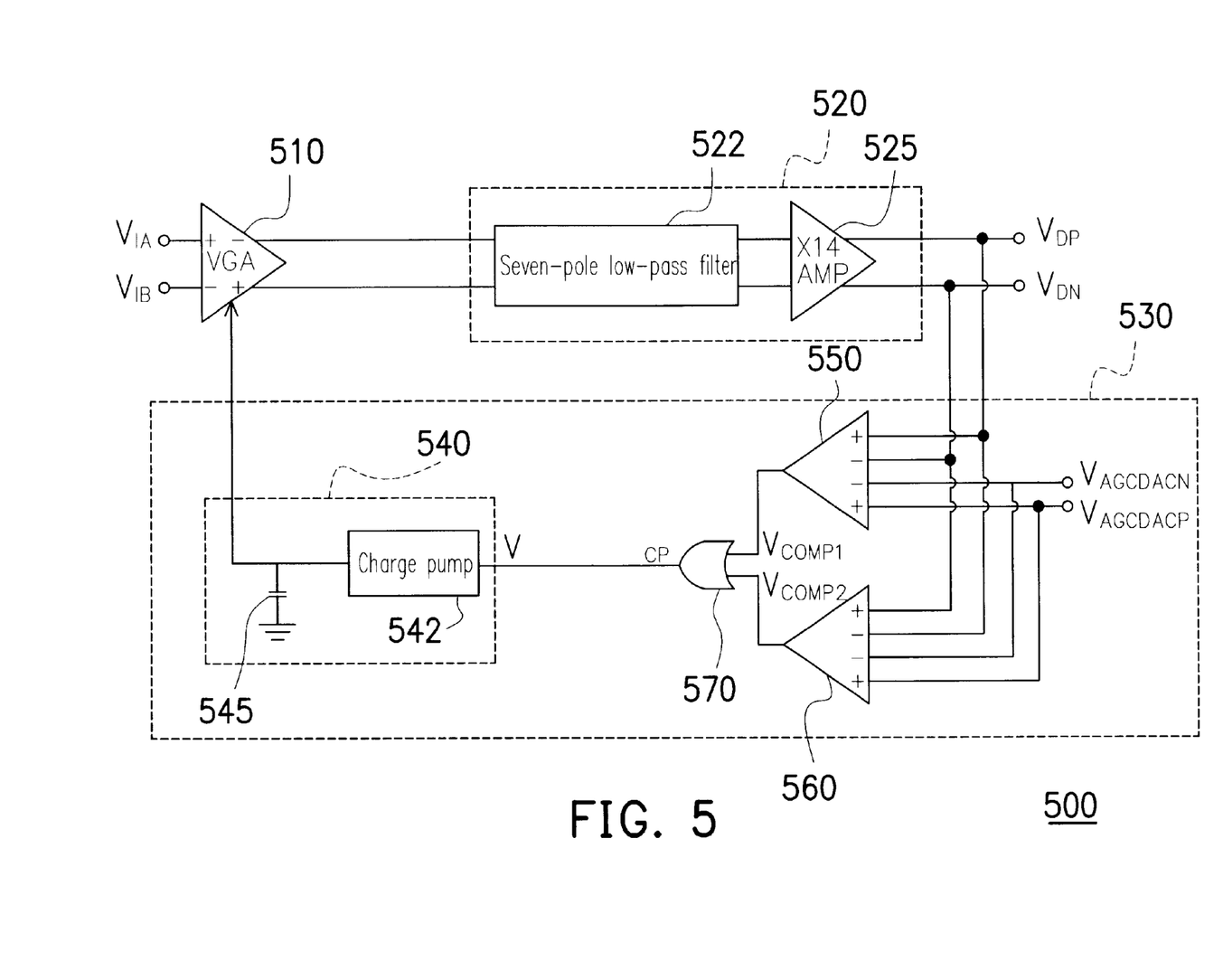
FIG. 5 is an equivalent circuit diagram of an automatic gain control circuit according to one preferred embodiment of the present invention.

FIG. 5 is an equivalent circuit diagram of an automatic gain control circuit according to one preferred embodiment of the present invention. As shown in FIG. 5, the automatic gain control circuit 500 includes a variable gain amplifier 510, a filtering circuit 520 and a peak value inspection circuit 530. The peak value inspection circuit 530 further includes a non-inverted phase differential comparator 550, an inverted phase differential comparator 560, an OR-gate 570 and a charge/discharge circuit 540. The charge/discharge circuit 540 is a system that includes a charge-pump circuit 542 and a capacitor 545 and the filtering circuit 520 is a system that includes a seven-pole low-pass filter 522 and an amplifier circuit 525 (having a fixed gain of about 14), for example.

Figure 6:
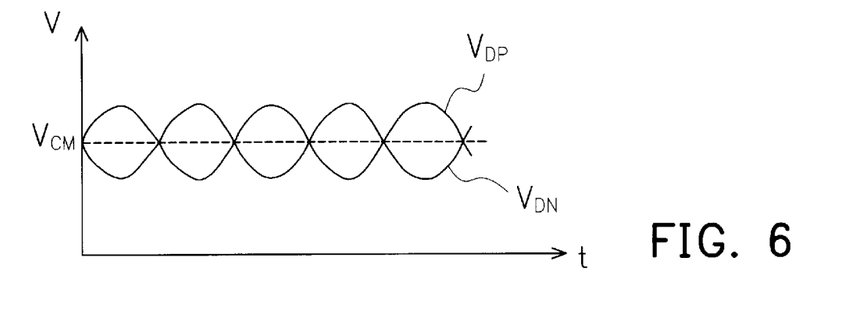
FIG. 6 is a graph showing the waveforms of output signals $V_{DP}$ and $V_{DN}$ produced by the circuit in FIG. 5.
Figure 7:
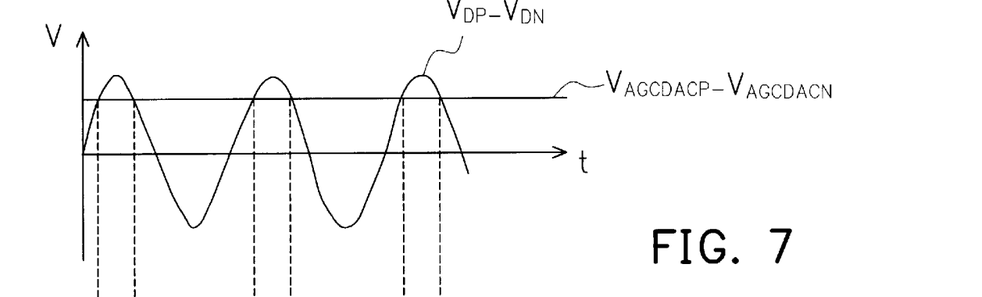
FIG. 7 is a graph showing the waveform of a differential output signal $V_{DP}-V_{DN}$ and a differential reference signal $V_{AGCDACP}-V_{AGCDACN}$ produced by the circuit in FIG. 5.
Figure 8:
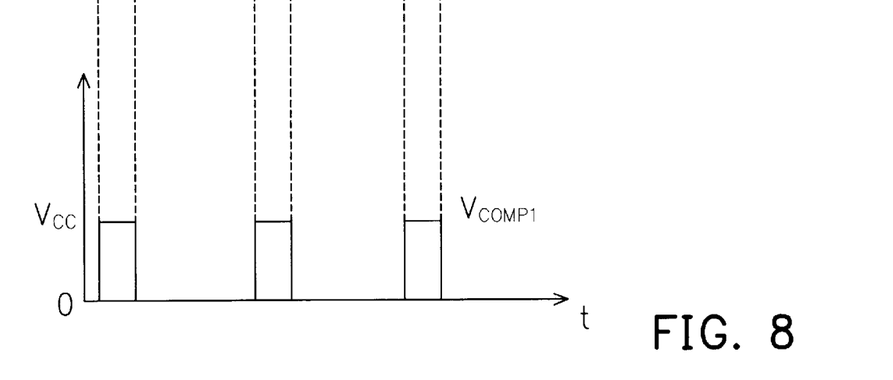
FIG. 8 is a graph showing the waveform of a non-inverted compare result signal $V_{COMP1}$ produced by the circuit in FIG. 5.
Figure 9:
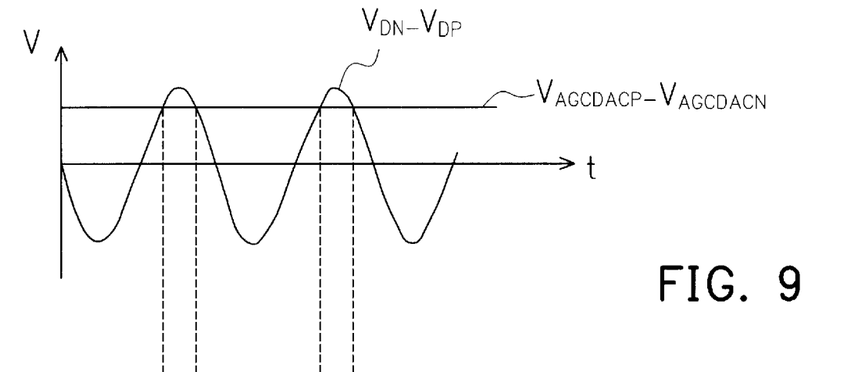
FIG. 9 is a graph showing the waveform of an inverted phase differential output signal $V_{DN}-V_{DP}$ and a differential reference signal $V_{AGCDACP}-V_{AGCDACN}$ produced by the circuit in FIG. 5.
Figure 10:
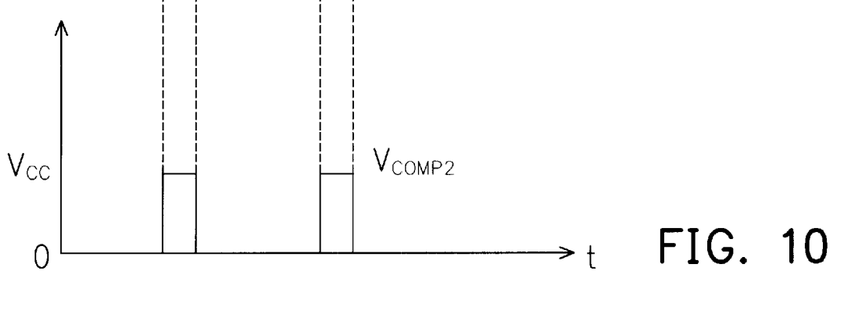
FIG. 10 is a graph showing the waveform of an inverted compare result signal $V_{COMP2}$ produced by the circuit in FIG. 5.
Figure 11:
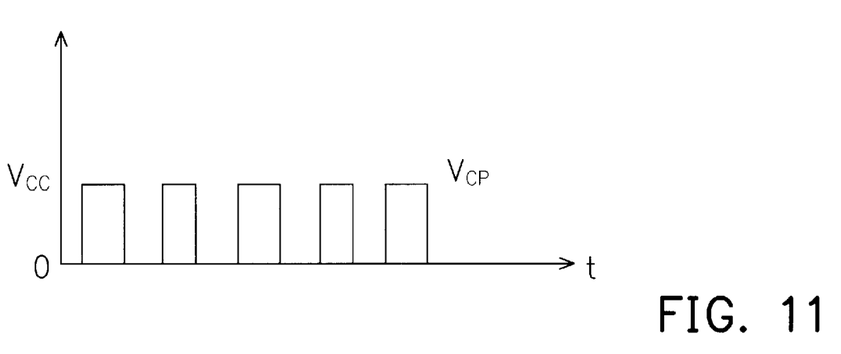
FIG. 11 is a graph showing the waveform of a combined compare result signal $V_{CP}$ produced by the circuit in FIG. 5.

Differential input signals $V_{IA}$, $V_{IB}$ pass through the variable gain amplifier 510 and the filtering circuit 520 to produce output signals $V_{DP}$, $V_{DN}$, which are non-inverted output signal and inverted output signal respectively. The gain of the variable gain amplifier 510 is variable as well as controllable. The peak value inspection circuit 530 monitors the actual output magnitude of $V_{DP}-V_{DN}$ and $V_{DN}-V_{DP}$ between the differential output signals $V_{DP}$ and $V_{DN}$. FIG. 6 is a graph showing the waveforms of the output signals $V_{DP}$ and $V_{DN}$. FIG. 7 is a graph showing the waveforms of a differential output signal $V_{DP}$–$V_{DN}$ and a differential reference signal $V_{AGCDACP}$–$V_{AGCDACN}$. FIG. 8 is a graph showing the waveform of a non-inverted compare result signal $V_{COMP1}$ generated by the non-inverted phase differential comparator 550. FIG. 9 is a graph showing the waveforms of an inverted phase differential output signal $V_{DN}$–$V_{DP}$ and the differential reference signal $V_{AGCDACP}$–$V_{AGCDACN}$. FIG. 10 is a graph showing the waveform of an inverted compare result signal $V_{COMP2}$ generated by the inverted phase differential comparator 560. The differential output signal $V_{DP}$–$V_{DN}$ and the differential reference signal $V_{AGCDACP}$–$V_{AGCDACN}$ are fed into the non-inverted phase differential comparator 550 while the inverted differential output signal $V_{DN}$–$V_{DP}$ and the differential reference signal $V_{AGCDACP}$–$V_{AGCDACN}$ are fed into the inverted phase differential comparator 560. Using the waveforms in FIGS. 7 and 9 as an example, the results of comparisons are shown in FIGS. 8 and 10. The non-inverted compare result signal $V_{COMP1}$ and the inverted compare result signal $V_{COMP2}$ pass through the OR-gate 570 to produce a combined compare result signal $V_{CP}$ as shown in FIG. 11. The combined compare result signal $V_{CP}$ is then sent to the charge/discharge circuit 540 for controlling the charge-pump circuit 540. Hence, the capacitor 545 is charged or discharged through the charge-pump circuit 540. By varying the potential difference across the capacitor 545, the gain of the variable gain amplifier 510 is readjusted.

When the amplitude of the output signals $V_{DP}$ and $V_{DN}$ is large and hence produces a high level combined compare result signal $V_{CP}$, the charge pump 540 is activated to discharge the capacitor 545 so that the potential difference across the capacitor 545 is lowered. Hence, the gain of the variable gain amplifier 510 is reduced and the amplitude of the output signals $V_{DP}$ and $V_{DN}$ is restored back to a desired level. On the contrary, when the amplitude of the output signals $V_{DP}$ and $V_{DN}$ is too small and hence produces a low level combined compare result signal $V_{CP}$, the charge pump 540 is activated to charge up the capacitor 545 so that the potential difference across the capacitor 545 is raised. Ultimately, the gain of the variable gain amplifier 510 is increased and the amplitude of the output signals $V_{DP}$ and $V_{DN}$ is restored back to the desired level.

A method for controlling the gain of differential input signals $V_{IA}$ and $V_{IB}$ according to the differential reference signal $V_{AGCDACP}$–$V_{AGCDACN}$ can also be derived from the aforementioned circuits. The method includes the following steps. First, the differential input signals $V_{IA}$ and $V_{IB}$ are amplified by a gain to produce an amplified signal. The magnitude of the gain can be controlled. The amplified signal is filtered to produce differential output signals $V_{DP}$ and $V_{DN}$. The differential output signals $V_{DP}$, $V_{DN}$ and the differential reference signal $V_{AGCDACP}$–$V_{AGCDACN}$ are differentially compared to produce a control signal for controlling the gain of the variable gain amplifier.

The method of generating the control signal further includes the following steps. A differential comparison between the differential output signal $V_{DP}$–$V_{DN}$ and the differential reference signal $V_{AGCDACP}$–$V_{AGCDACN}$ is carried out to produce a non-inverted compare result signal $V_{COMP1}$. A differential comparison between an inverted differential output signal $V_{DN}$–$V_{DP}$ and the differential reference signal $V_{AGCDACP}$–$V_{AGCDACN}$ is carried out to produce an inverted compare result signal $V_{COMP2}$. Thereafter, an OR operation between the non-inverted compare result signal $V_{COMP1}$ and the inverted compare result signal $V_{COMP2}$ is carried out to produce a combined compare result signal $V_{CP}$. According to the combined compare result signal $V_{CP}$ resulting from the combination of comparisons and OR-operation, the control signal for controlling the gain of the variable gain amplifier is adjusted.

In conclusion, the peak value inspection circuit of the present invention uses the actual amplitude of the differential output signals to compare with a reference signal rather than processing the output signals through an external circuit. Hence, major advantages of this invention includes:

1. Circuit structure is simplified considerably indicating a great reduction in chip layout area and power consumption.
2. The restriction of using a circuit having a low operating voltage is lifted. Therefore, complementary metal-oxide-semiconductor (CMOS) technologies may be used to fabricate the control circuit.
3. Without an external circuit to process the output signals, the output signals only include the input loading of the comparators. Hence, signal bandwidth of the automatic gain control circuit is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An automatic gain control circuit capable of receiving differential input signals and a plurality of reference signals, comprising:

a variable gain amplifier for amplifying said differential input signals to produce an amplified signal according to a gain, wherein said gain is variable;

a filtering circuit for filtering said amplified signal to produce differential output signals; and a peak value inspection circuit for comparing said differential output signals and said plurality of reference signals differentially to produce a control signal that controls said gain of said variable gain amplifier.

2. The automatic gain control circuit of claim 1, wherein the peak value inspection circuit includes:

a non-inverted differential comparator for comparing said differential output signals and said plurality of reference signals differentially to produce a non-inverted compare result signal;

an inverted differential comparator for comparing an inverted differential output signals of said differential output signals and said plurality of reference signals differentially to produce an inverted compare result signal;

an OR-gate for performing an OR operation between said non-inverted compare result signal and said inverted compare result signal to produce a combined compare result signal; and a charge/discharge circuit for converting said combined compare result signal to said control signal that controls said gain of said variable gain amplifier.

3. The automatic gain control circuit of claim 2, wherein the charge/discharge circuit includes a charge-pump circuit and a capacitor.

4. The automatic gain control circuit of claim 1, wherein the filtering circuit includes a low-pass filter.

5. The automatic gain control circuit of claim 4, wherein the filtering circuit further includes an amplifier circuit for driving said differential output signals.

6. An automatic gain control circuit capable of receiving a pair of input signals and a pair of reference signals, comprising:

a variable gain amplifier for amplifying said pair of input signals to produce a pair of amplified signals according to a gain, wherein said gain is variable;

a filtering circuit for filtering said pair of amplified signals to produce a pair of output signals;

a first differential comparator for comparing a first difference of said pair of output signals and a difference of said pair of reference signals to produce a first compare result signal;

a second differential comparator for comparing a second difference of said pair of output signals and said difference of said pair of reference signals to produce a second compare result signal;

an OR-gate for performing an OR operation between said first compare result signal and said second compare result signal to produce a combined compare result signal; and a charge/discharge circuit for converting said combined compare result signal to a control signal that controls said gain of said variable gain amplifier.

7. The automatic gain control circuit of claim 6, wherein said pair of output signals comprises a non-inverted output signal and an inverted output signal.

8. The automatic gain control circuit of claim 7, wherein said first difference of said pair of output signals is generated either by subtracting said non-inverted output signal from said inverted output signal or by subtracting said inverted output signal from said non-inverted output signal.

9. The automatic gain control circuit of claim 8, wherein said second difference of said pair of output signals is generated by a way different to the generation of said first difference.

10. The automatic gain control circuit of claim 6, wherein the charge/discharge circuit includes a charge-pump circuit and a capacitor.

11. The automatic gain control circuit of claim 6, wherein the filtering circuit includes a low-pass filter.

12. The automatic gain control circuit of claim 11, wherein the filtering circuit further includes an amplifier circuit for driving said pair of output signals.

13. A method for controlling a gain of a variable gain amplifier, comprising the steps of:

amplifying a differential input signal according to said gain to produce an amplified signal, wherein said gain is variable;

transforming said amplified signal to produce a plurality of output signals; and comparing said plurality of output signals to a plurality of output signals differentially to produce a control signal that controls said gain.

14. The method of claim 13, wherein the step of producing said control signal includes the sub-steps of:

comparing said differential output signal and said reference signals differentially to produce a non-inverted compare result signal;

comparing an inverted signal of said plurality of output signals and said plurality of reference signals differentially to produce an inverted compare result signal;

performing an OR operation on said non-inverted compare result signal and said inverted compare result signal to produce a combined compare result signal; and modifying said control signal according to said combined compare result signal.

* * * * *